(12) United States Patent
Chen et al.

(10) Patent No.: US 8,944,739 B2
(45) Date of Patent: Feb. 3, 2015

(54) LOADPORT BRIDGE FOR SEMICONDUCTOR FABRICATION TOOLS

(75) Inventors: Shih-Hung Chen, Zhubei (TW); Ying Xiao, Zhubei (TW); Chin-Hsiang Lin, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 224 days.

(21) Appl. No.: 13/486,024

(22) Filed: Jun. 1, 2012

(65) Prior Publication Data

US 2013/0322990 A1 Dec. 5, 2013

(51) Int. Cl.
*H01L 21/677* (2006.01)

(52) U.S. Cl.
USPC .......................................... 414/217; 414/939

(58) Field of Classification Search
USPC .................................. 414/217, 939
See application file for complete search history.

(56) References Cited

U.S. PATENT DOCUMENTS

| | | | |
|---|---|---|---|
| 6,468,021 B1 * | 10/2002 | Bonora et al. | 414/522 |
| 6,481,558 B1 * | 11/2002 | Bonora et al. | 198/346.2 |
| 6,851,913 B2 * | 2/2005 | Iizuka | 414/626 |
| 7,217,076 B2 * | 5/2007 | Bonora et al. | 414/217.1 |
| 7,410,340 B2 * | 8/2008 | Bonora et al. | 414/217.1 |
| 7,419,346 B2 * | 9/2008 | Danna et al. | 414/222.11 |
| 7,445,415 B2 * | 11/2008 | Bonora et al. | 414/217.1 |
| 7,578,650 B2 * | 8/2009 | Aalund et al. | 414/806 |
| 7,771,151 B2 | 8/2010 | Bonora et al. | |
| 2002/0197136 A1 * | 12/2002 | Huang et al. | 414/217 |
| 2005/0079041 A1 * | 4/2005 | Campbell et al. | 414/626 |
| 2007/0269302 A1 | 11/2007 | Kim et al. | |
| 2010/0167503 A1 * | 7/2010 | Lei et al. | 438/478 |
| 2010/0173439 A1 * | 7/2010 | Lei et al. | 438/57 |

FOREIGN PATENT DOCUMENTS

| | | |
|---|---|---|
| KR | 10-2007-0029032 A | 3/2007 |
| KR | 10-0806250 B1 | 2/2008 |
| KR | 10-0832772 B1 | 5/2008 |
| KR | 10-1088050 B1 | 11/2011 |

OTHER PUBLICATIONS

Notice of Allowance issued Mar. 18, 2014 in counterpart Korean Patent Application No. 10-2012-0094793.

* cited by examiner

*Primary Examiner* — Kaitlin Joerger
(74) *Attorney, Agent, or Firm* — Duane Morris LLP

(57) ABSTRACT

A wafer handling system with apparatus for transporting wafers between semiconductor fabrication tools. In one embodiment, the apparatus is a loadport bridge mechanism including an enclosure having first and second mounting ends, a docking port at each end configured and dimensioned to interface with a loadport of a semiconductor tool, and at least one wafer transport robot operable to transport a wafer between the docking ports. The wafer transport robot hands off or receives a wafer to/from a tool robot at the loadports of a first and second tool. The bridge mechanism allows one or more wafers to be transferred between loadports of different tools on an individual basis without reliance on the FAB's automated material handling system (AMHS) for bulk wafer transport inside a wafer carrier such as a FOUP or others.

19 Claims, 9 Drawing Sheets

LOADPORT BRIDGE FOR SEMICONDUCTOR FABRICATION TOOLS

TECHNICAL FIELD

The present disclosure generally relates to semiconductor manufacturing foundries or facilities, and more particularly to a loadport bridge for transporting wafers between semiconductor fabrication tools.

BACKGROUND

Automated Material Handling Systems (AMHS) have been widely used in semiconductor fabrication facilities ("FABS") to automatically handle and transport groups or lots of wafers between various processing machines ("tools") used in chip manufacturing. A typical FAB generally includes one or more floors having a plurality of process bays including processing, metrology, and inspection tools and wafer staging equipment such as stockers which are interconnected by the AMHS. The AMHS is computer controlled for handling the staging of wafers for processing and flow of wafer traffic in the FAB.

Multiple wafers are typically stored and transported together in wafer carriers by the AMHS between the loadports of different wafer processing or other tools during the semiconductor fabrication process. The wafer carriers include standard mechanical interface (SMIF) pods which can hold a plurality of wafers (e.g. 200 mm or 8 inch), or front opening unified pods (FOUPs) which can hold larger 300 mm (12 inch) or 450 mm (18 inch) wafers. Typically, each wafer carrier holds on the order of approximately 25 wafers.

The AMHS in a semiconductor FAB includes numerous types of automated and manual vehicles for moving and transporting the wafer carriers throughout the FAB during the manufacturing process. This can include for example automatic guided vehicles (AGVs), personal guided vehicles (PGVs), rail guided vehicles (RGVs), overhead shuttles (OHSs), and overhead hoist transports (OHTs).

Of the foregoing AMHS wafer transport mechanisms, OHTs are commonly used to transport wafer carriers, such as FOUPs or SMIFs, from the loadport of one tool to the loadport of the next tool in the processing sequence. An OHT system includes "vehicles" that travel on an overhead monorail of the AMHS. The OHT vehicle on-board hoist is operable to raise and lower wafer carriers allowing the OHT vehicle to deposit and retrieve wafer carriers from the loadports of tools positioned along and on the floor beneath the overhead rail.

The time that it takes for the AMHS to transport wafers between semiconductor fabrication tools is one important metric since the transport time affects the FAB production efficiency, and sometimes adversely affects wafer quality in some situations. Air impurities within the FAB can contaminate wafers during transport between machines if exposed to the FAB atmosphere for too great a period of time, particularly since some wafers can be more sensitive to contaminants depending on the type of fabrication process just completed in the tool. Accumulation time, or "Q time" for short, is a measure of the time that it takes for a wafer to travel from the loadport of a first tool to the loadport of the second tool in the fabrication sequence. Accordingly, it is a general goal to keep Q time as short as possible for both potential wafer contamination and fabrication efficiency reasons. The AMHS, however, is susceptible to OHT vehicle bottle necks and "traffic jams" which delays wafer transport between tools and reduces Q time.

An improved system and method for transporting wafers between semiconductor fabrication process tools is desired.

BRIEF DESCRIPTION OF THE DRAWINGS

The features of the embodiments will be described with reference to the following drawings where like elements are labeled similarly, and in which.

Figure 1:
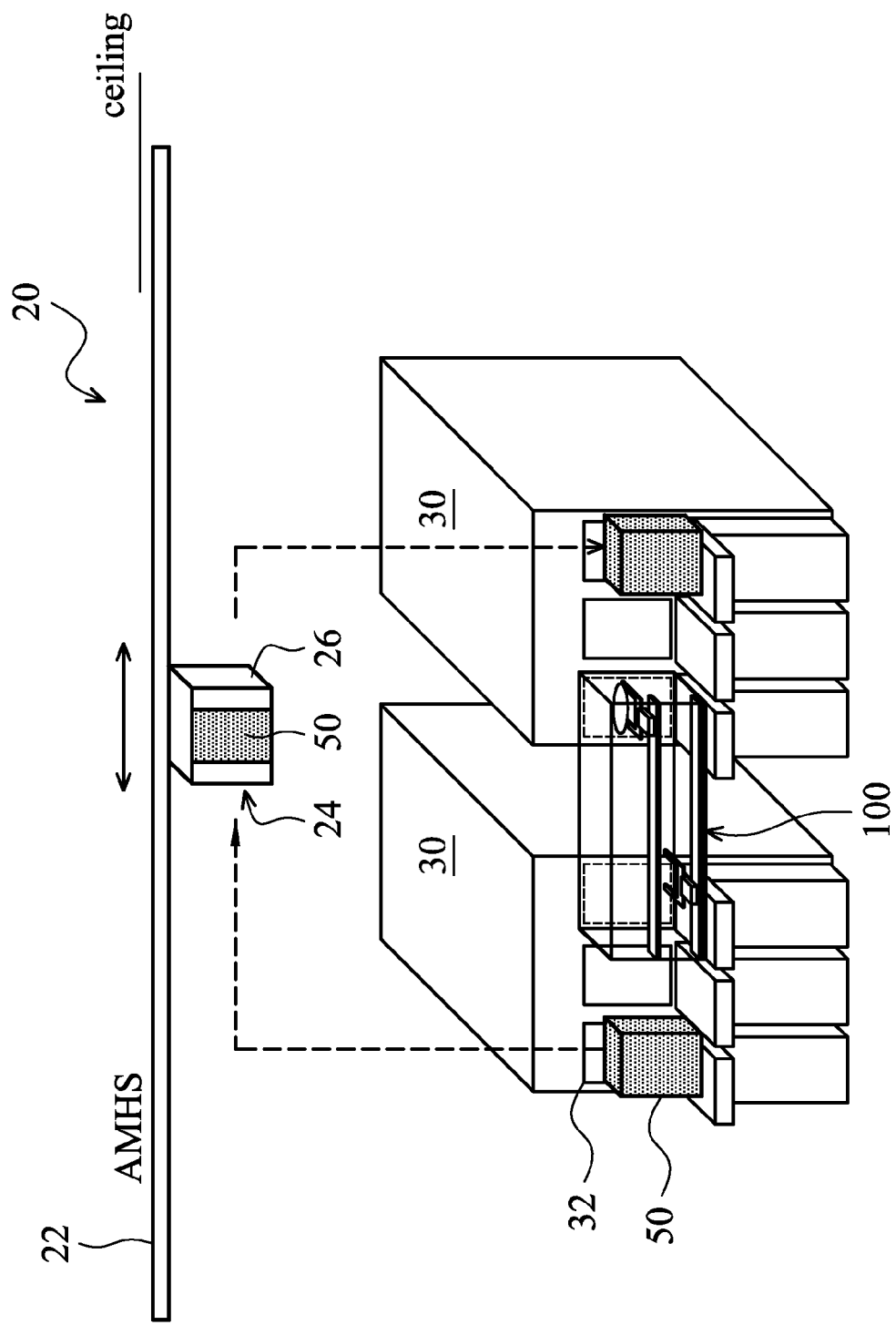
FIG. 1 is a schematic perspective drawing of an exemplary embodiment of a portion of a semiconductor FAB and AMHS including semiconductor tools, an OHT rail system for wafer carrier transport, and loadport bridge mechanism according to the present disclosure.

All drawings are schematic and are not drawn to scale.

DETAILED DESCRIPTION

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that can exist alone or in other combinations of features; the scope of the disclosure being defined by the claims appended hereto. The terms "chip" and "die" are used interchangeably herein.

Figure 2:
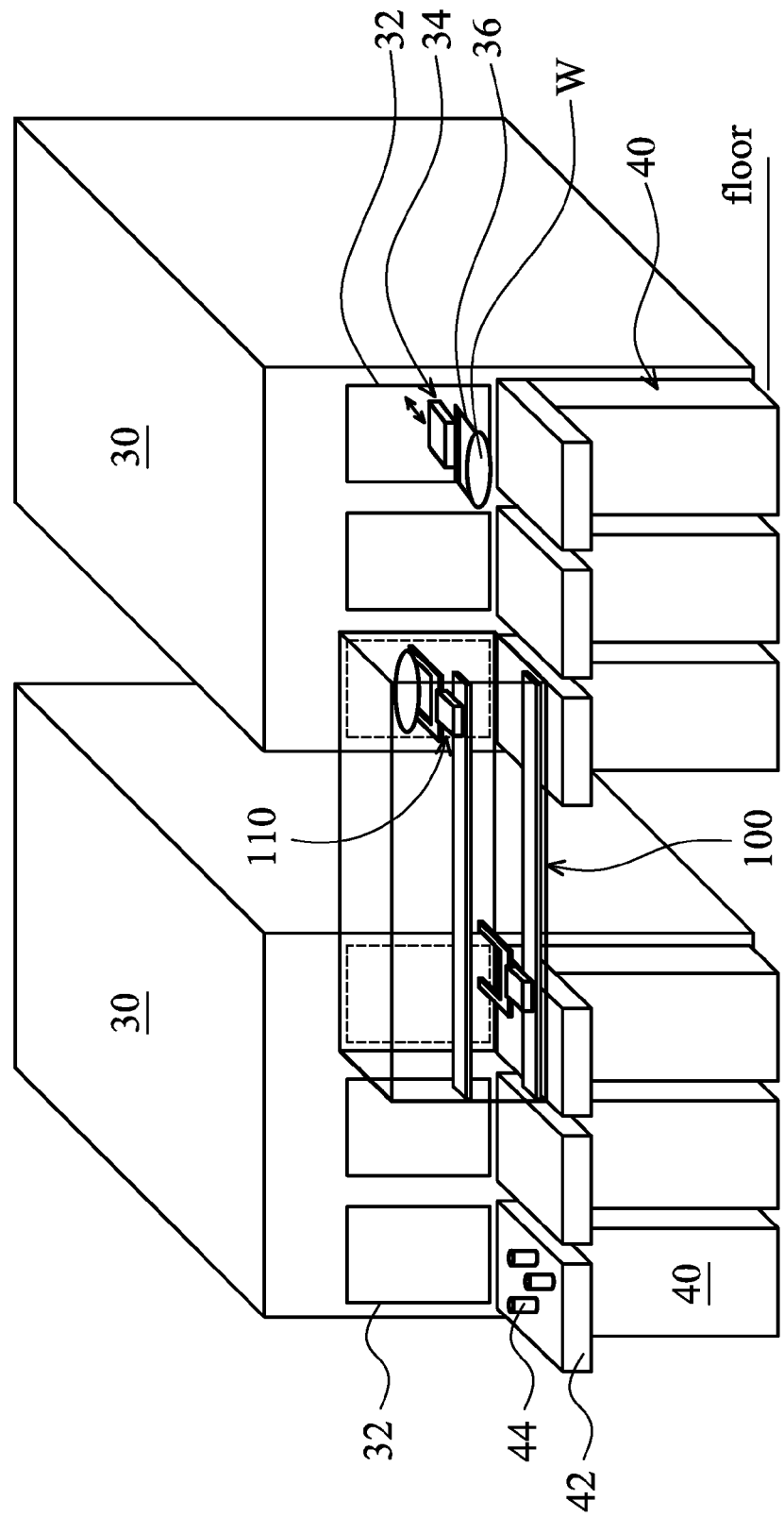
FIG. 2 is an enlarged perspective view thereof.

FIGS. 1 and 2 are schematic perspective diagrams of one possible embodiment of an automated material handling system (AMHS) 10 for a semiconductor fabrication facility (FAB) with an apparatus for transporting wafers between loadports of semiconductor tools. In one embodiment, the apparatus is a semiconductor tool loadport bridge mechanism 100 having a motor-driven wafer transport robot and track system as further described herein.

In some embodiments, the AMHS 10 includes one or more OHT systems 20 including a network of stationary tracks or rails 22 operable to guide the movement of one or more wheeled OHT vehicles 24 supported and suspended from the rails 22. In some embodiments, the rails 22 are monorails that are mounted to and suspended from the ceiling and/or walls of the FAB. Rails 22 have any suitable cross-sectional configuration as will be appreciated by those in the art so long as the OHT vehicle 62 are appropriately supported from the rail for rolling motion.

OHT vehicles 24 are operable to transport wafer carriers 50 through the FAB 20 for intra-bay or inter-bay movement. OHT vehicles 24 are configured and structured to hold a wafer carrier 50 housing a plurality of wafers W and transport the carrier 50 in a generally horizontal or lateral direction from one location to another within the FAB.

Figure 4:
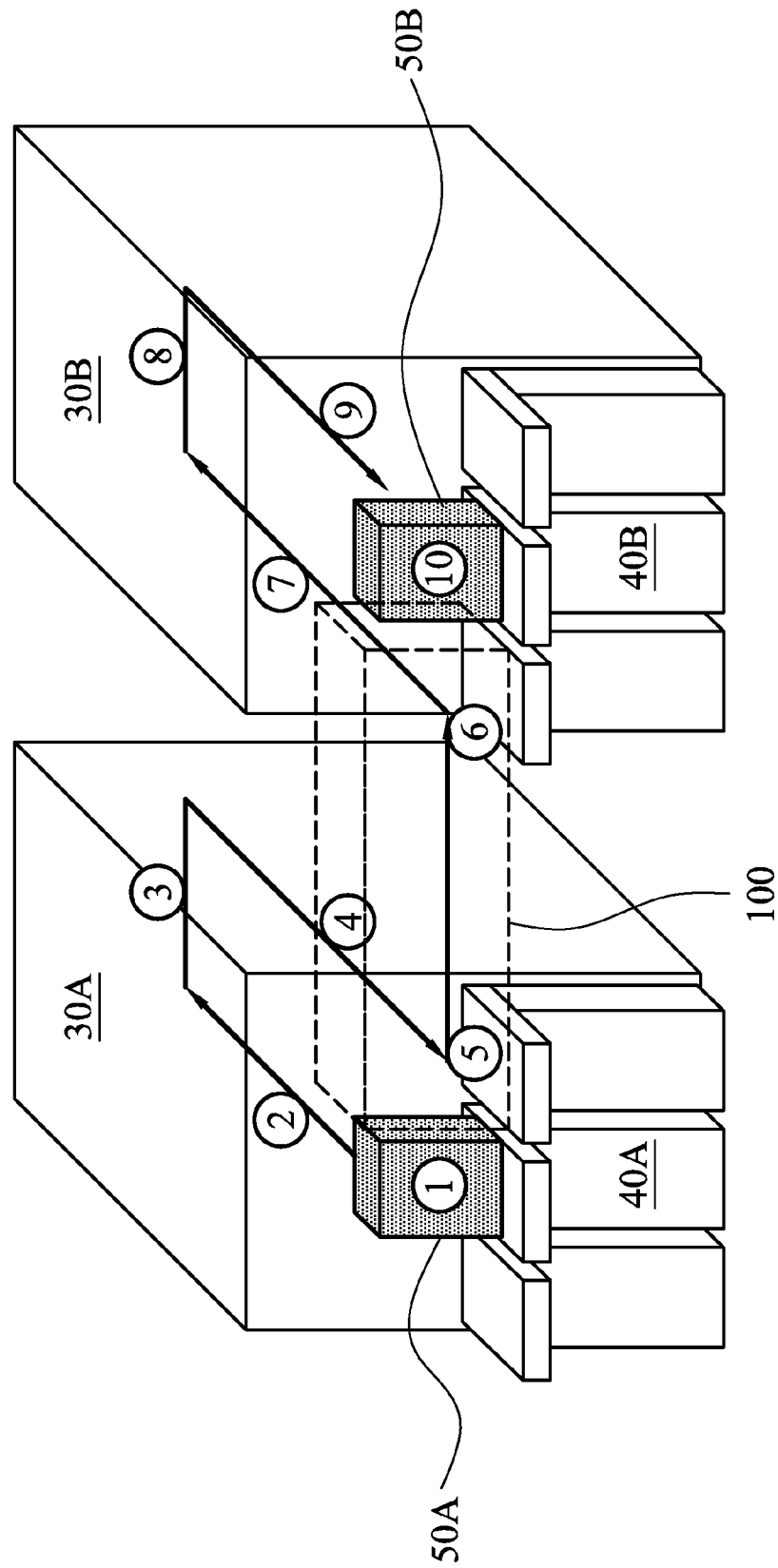
FIG. 4 is schematic perspective drawing similar to FIG. 2 showing one embodiment of a possible wafer flow transport path using the loadport bridge mechanism of FIGS. 1-3.

Referring to FIGS. 1 and 4, OHT vehicles 24 are configured and operable to pickup, raise/lower, hold, articulate, and release a wafer carrier 50. Such OHT vehicles and rails systems are known in the art and commercially available from companies such as Daifuku Company, Ltd. of Osaka, Japan and Muratec Automation Company, Ltd. of Aichi, Japan, and others. OHT vehicles 24 include a motor-driven or pneumatic hoisting mechanism 26 generally comprised of gripper assembly including one or more retractable and extendable gripper arms having a gripper on the end thereof configured for locking onto a mating hook or flange on the wafer carrier 50. The hoisting mechanisms 26 are operable to vertically raise and lower the gripper and attached wafer carrier 50.

Referring to FIGS. 1 and 2, wafer carrier 50 is any type of wafer carrier such as a SMIF pod or FOUP. Each wafer carrier 50 holds a plurality of wafers. For example, some embodiments of a FOUP are configured to hold approximately 25 wafers. A SMIF pod or FOUP includes various appurtenances as will be known to those in the art, including without limitation coupling mechanisms for docking to a loading port of a semiconductor tool or stocker, hooks or flanges for grasping by the gripper of an OHT vehicle hoist mechanism 26, side rails for pickup by a robotic arm, plurality of horizontal internal slots for holding the wafers in spaced vertical relationship, and openable/closeable and sealable doors to maintain the wafers in a controlled environment during transport isolated from the ambient FAB conditions to prevent contamination. Wafer carriers are commercially-available from various companies, such as for example Entegris, Inc. of Billerica, Mass. and others.

With continuing reference to FIGS. 1 and 2, a plurality of semiconductor fabrication process-related tools 30 are provided in a typical FAB which can be supported from the floor(s) of the FAB. Tools 30 can be any type of wafer processing, metrology, inspection, testing, or other tool typically used in semiconductor wafer processing and production (collectively referred to herein as tool or semiconductor tool). Each semiconductor tool 30 includes one or more loadports 40 operable for supporting and docking wafer carriers 50 to facilitate insertion and removal of wafers W into/from the tool. In some embodiments, the loadports 40 conform to the SEMI BOLTS interface standard. Multiple loadports 40 facilitate wafer loading and unloading into/from the tools 30 to expedite wafer carrier 50 switchover between the OHT system 60 and tool 30 for minimizing Q time. In some possible embodiments, for example without limitation, three loadports 40 are provided as shown for flexibility in staging wafer carriers 50.

Referring to FIGS. 1 and 2, each semiconductor tool 30 further includes a tool access door 32 through which wafers W are loaded into and unloaded from the tool. Doors 32 are configured for docking with wafer carriers 50 and in some embodiments include appropriate elastomeric or rubber seals for forming a seal with the wafer carriers to minimize exposure of the wafers W to the FAB ambient atmosphere. In some embodiments, doors 32 have a generally rectangular or square shape to complement the configuration of a FOUP access door.

In some embodiments, the semiconductor tool 30 includes a wafer handling system comprising one or more wafer handling robots 34 as are well known in the art which are operable to selectively retrieve or load a wafer W from/into the wafer carrier 50 through a respective tool access door 32 at loadports 40. Such tool robots 34 have one or more automated articulating robotic arms 36 terminating in a gripper configured and operable for multi-directional movement and to grasp or release a wafer W as will be known to those in the art. For example, since wafers are oriented horizontally, but stacked vertically in slots in some wafer carriers such as FOUPs, the robotic arms 36 are capable of straight line motion in a horizontal plane to retrieve and insert wafers from/into the carriers 50. The robotic arms 36 are typically further capable of at least some degree of vertical movement up and down the stacked wafers to select wafers from various storage slots or levels in the wafer carrier. In some embodiments, robotic arms 36 are further be capable of combination or "gross" motion consisting of angular and liner motion to transport wafers between different approach positions to the tool 30 and within the tool.

The automated wafer handling tool robots 34 are motor-driven and operated via a computer or microprocessor based control system associated with each tool 30 that is programmable with software for controlling the movements of the robotic arms 36. The robotic arms 36 have any suitably shaped wafer gripper including a bifurcated U-shaped or V-shaped gripper (see, e.g. FIG. 2), straight gripper, or any other configuration so long as the gripper is operable to securely grip and hold a wafer with appropriate gripping force.

Wafer handling robots and systems are well known in the art and commercially available from many companies such as without limitation Kensington Laboratories, LLC of Hayward, Calif., Brooks Automation, Inc. of Santa Clara, Calif., and others.

Figure 3:
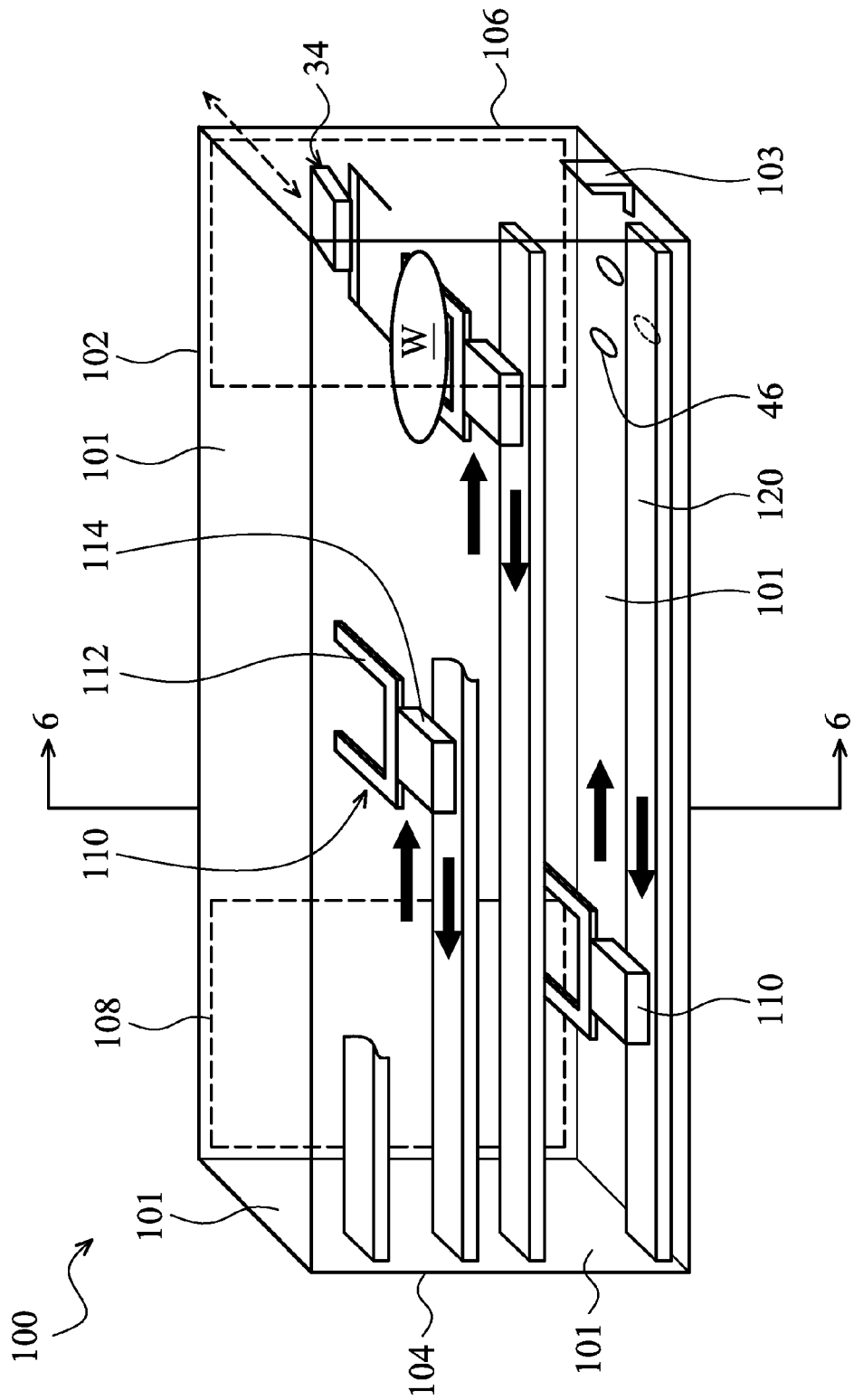
FIG. 3 is a schematic perspective drawing of the loadport bridge mechanism of FIGS. 1 and 2.
Figure 10:
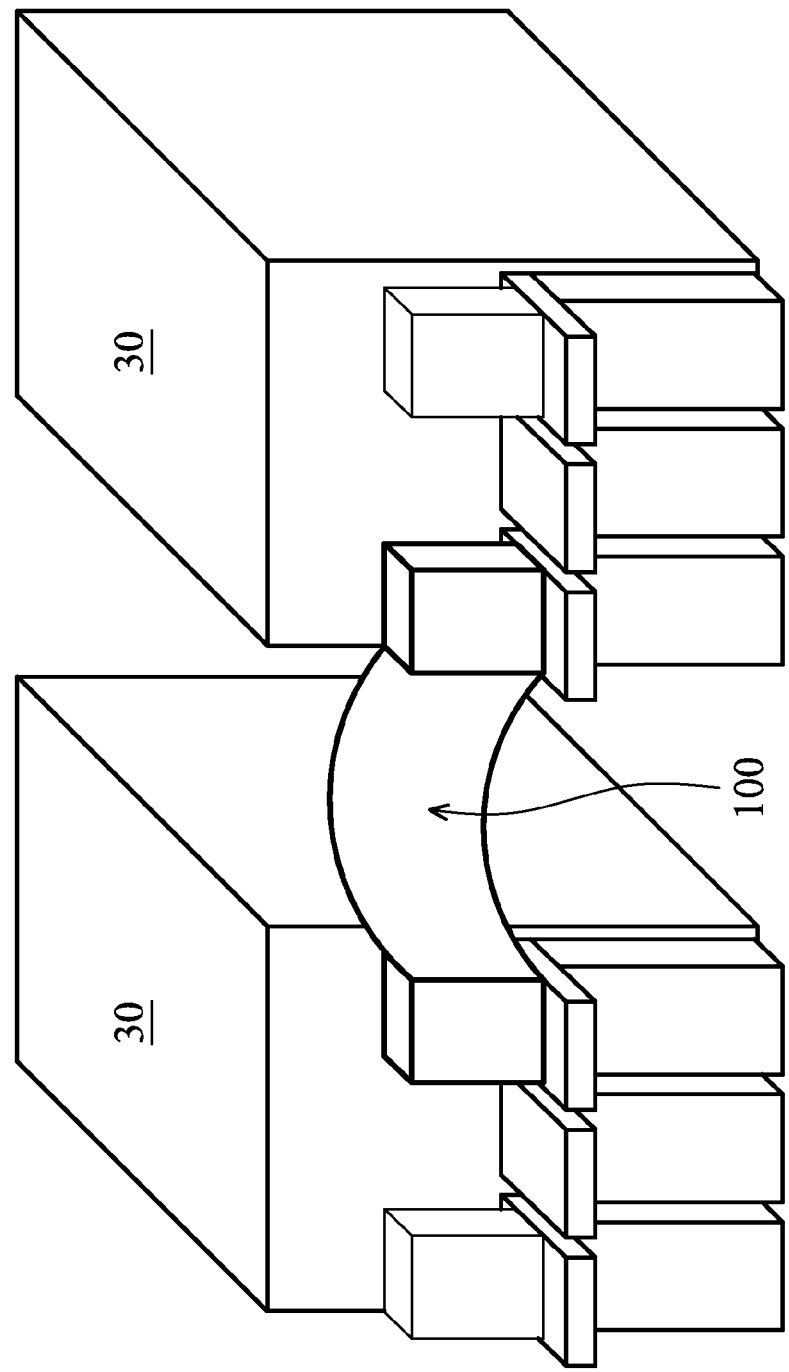
FIG. 10 is a schematic perspective drawing of an alternative configuration for the loadport bridge mechanism.

Referring now to FIGS. 1-3, a loadport bridge mechanism 100 is provided for transporting one or more individual wafers between semiconductor fabrication process tools outside of the wafer carrier such as a FOUP. FIG. 3 is an enlarged schematic perspective diagram of the loadport bridge mechanism alone. The loadport bridge mechanism 100 includes an elongated housing or enclosure 102 having first and second mounting ends 104, 106, and a docking port 108 disposed at each end that is configured and dimensioned to interface with a tool access door 32 of tool 30. In some embodiments, the enclosure 102 has a generally rectangular overall configuration or shape with a square or rectangular cross-section as shown (see also FIG. 6). Other suitable configurations can be used. As shown for example, in FIG. 10, enclosure 102 need not have a completely straight or horizontal configuration between the ends of the enclosure, but rather may have a central portion that is curved or otherwise shaped for various reason including to avoid obstacles in the FAB, provide greater access between semiconductor fabrication tools, etc. In this embodiment, the wafers W travel along an arcuate path through at least of portion of loadport bridge mechanism 100.

Enclosure 102 can be made of any suitable material, including without limitation metal (e.g. aluminum, steel, titanium, etc. and various metal alloys) or non-metal (e.g. glass reinforced or unreinforced plastics, composites, etc.). Enclosure 102 is made of metal in one contemplated embodiment.

In some embodiments, enclosure 102 is formed of multiple panels 101 which are joined together (see FIG. 3). The enclosure sides, top, bottom, and end panels 101 can be joined together by any suitable method including mechanical fasteners (e.g. screws, bolts, rivets, etc.), welding, adhesives, etc. depending on the type of materials selected for the panels. The seams between panels can be sealed by welding, soldering, sealants, etc. to provide a sealed and controlled environment within the enclosure 102. The sealing method selected will be based on the type of material used for panels 101. An internal support frame comprised of various structural members 103 of suitable size and shapes is provided in some embodiments for mounting the enclosure panels 101 thereto. FIG. 3 shows a representative partial portion of one type of support frame structural member 103 in the form of an angle.

Referring to FIG. 3, docking ports 108 form openings through which wafers in loadport bridge mechanism 100 are transferred to/from tool access doors 32 (see FIG. 2). Accordingly, docking ports 108 are complementary configured with the tool access doors 32 in some embodiments to provide a relatively tight fit-up to the doors. In some embodiments, an elastomeric or rubber O-ring or seal is furnished around the perimeter of the docking port openings to seal against the tool access doors 32 for establishing a controlled environment within the loadport bridge mechanism enclosure 102.

It will be appreciated that the loadport bridge mechanism 100 may incorporate a HEPA system or other filtering/gas purging system as is well known in the art to create a controlled environment within enclosure 102 to meet specific environmental needs like cleanness level, low oxygen environment, etc.

Referring to FIGS. 1-3, loadport bridge mechanism 100 further includes its own wafer handling system. In one embodiment, loadport bridge mechanism 100 includes at least one motor-driven bridge wafer transport robot 110 that is movable along a stationary track 120 mounted to and supported by the loadport bridge mechanism enclosure 102 by any suitable manner. Track(s) 120 are attached to the ends 104, 106 of enclosure 102 and/or from the front or back sidewall panels 101 such as by direct attachment to the enclosure panels or via suitably shaped structural members such as angle brackets.

Wafer transport robot 110 is operable to carry a wafer W longitudinally through loadport bridge mechanism 100 from end to end 104, 106 between docking ports 108 along track 120 as best shown in detail in FIG. 3. Track 120 defines an axial wafer movement path through enclosure 102. The wafer transport robot 110 hands off or receives a wafer to/from the tool robot 34 at the loadport 40 through tool access door 32. In one embodiment, as shown, the wafer transport robot 110 is operable with bi-directional movement and traverses track 120 back and forth in two opposing axial directions (see directional arrows in FIG. 3).

Figure 6:
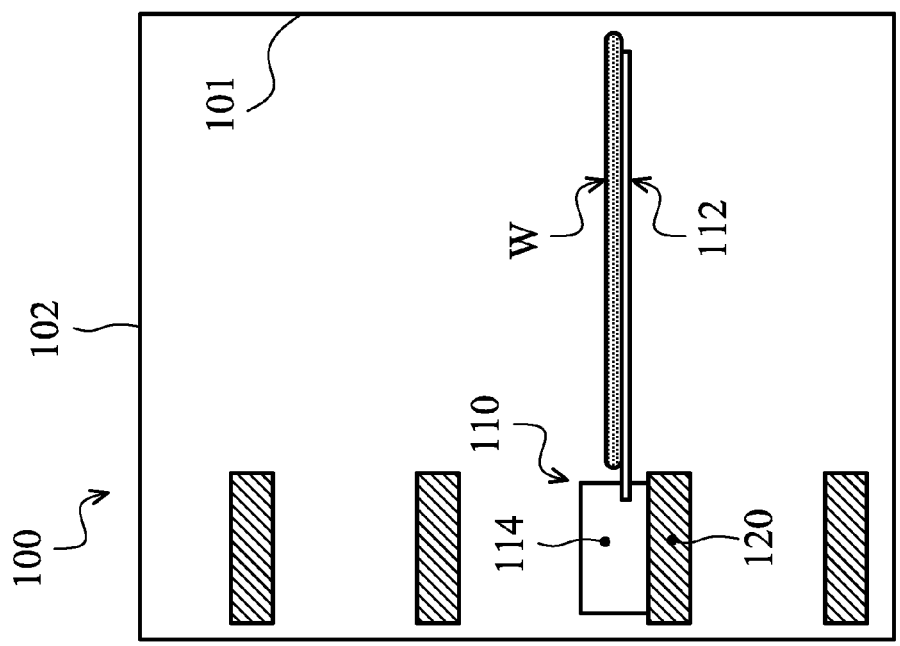
FIG. 6 is a cross-sectional view of the loadport bridge mechanism taken along line 6-6 in FIG. 3.

FIG. 6 is a cross-sectional view through loadport bridge mechanism 100 showing additional details of construction.

The loadport bridge mechanism 100 advantageously allows a single wafer W to be independently transferred between loadports of different tools on an individual basis outside of a wafer carrier like a FOUP, and without relying on the FAB's automated material handling system (AMHS) for wafer transport. According, wafer transport between loadports of different tools can be accomplished independently of the AMHS and is not affected by OHT vehicles 24 traffic jams and resulting delays in the AMHS. In addition, the loadport bridge mechanism 100 described herein beneficially reduces wafer traffic in the AMHS thereby helping relieve traffic congestion in the first place and reducing Q-time.

With continuing reference to FIGS. 1-3 and 6, wafer transport robot 110 in some embodiments further includes a motor-driven base 114 movable by an appropriate electric motor drive mechanism coupled to the track system which is configured and operable for moving the base axially along track 120. Motor-driven base 114 is complementary configured with track 120 to provide guided movement of the base along the track in an axial longitudinal direction along longitudinal axis LA (see, e.g. FIGS. 8 and 9) without lateral or sideways slippage off the track (i.e. transverse to the longitudinal axis of the track).

Figure 8:
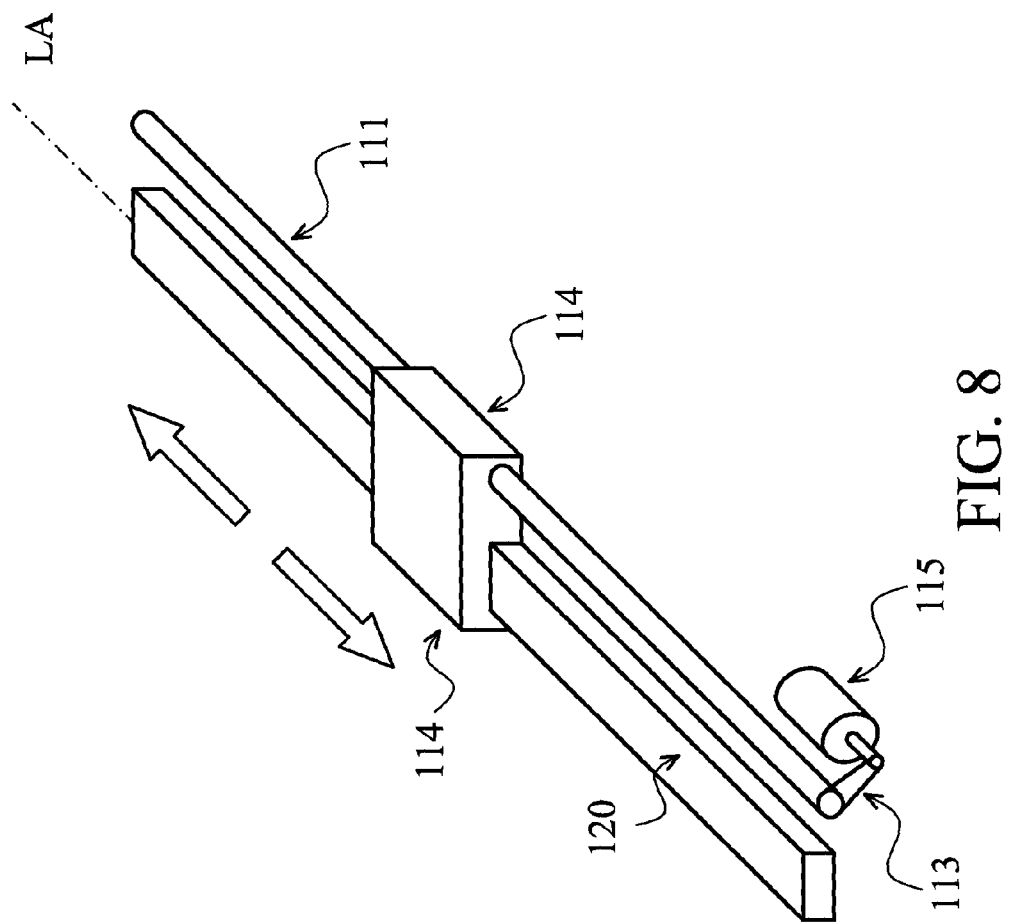
FIG. 8 is a schematic perspective drawing of one embodiment of a motor drive mechanism for the loadport bridge mechanism.
Figure 9:
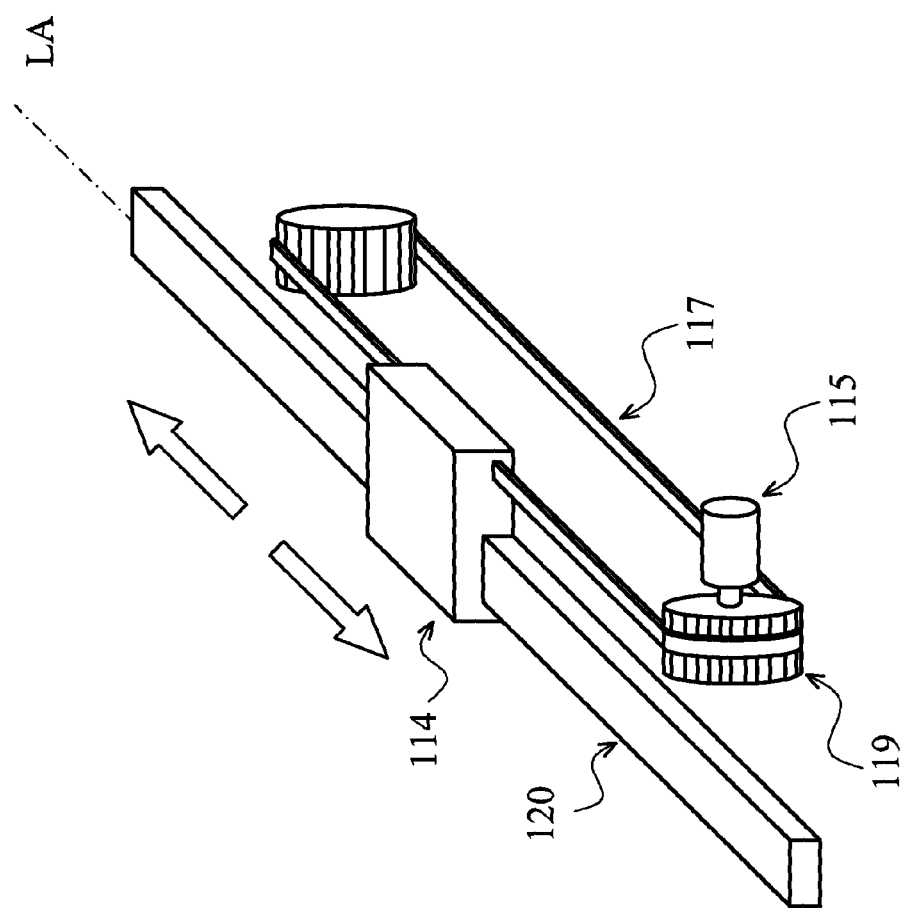
FIG. 9 is a schematic perspective drawing of another embodiment of a motor drive mechanism for the loadport bridge mechanism.

FIGS. 8 and 9 show two possible, but non-limiting, examples of an electric motor drive mechanism suitable for driving wafer transport robot 110. FIG. 8 shows a lead screw mechanism including a reversible stepper motor 115 which is mechanically coupled by a suitable coupling 113 to a lead screw 111 to which the movable base 114 is coupled for axial movement. The operation of stepper motor is controlled by a suitably configured controller, which is operable to rotate the drive shaft of the motor 115 and correspondingly lead screw 111 coupled to the motor drive shaft in opposing forward and reverse rotational directions thereby moving robot 110 in opposing axial directions along track 120 in the direction of the longitudinal axis LA through loadport bridge mechanism 100. Stepper motor 115 may be directly coupled to lead screw 111 in some embodiments, and may be a variable speed motor.

FIG. 9 shows a belt drive mechanism which is a variation of the motor drive mechanism shown in FIG. 8, but instead includes a pair of axially spaced gears 119 and a continuous loop belt 117 of suitable material to which robot base 114 is coupled for axial movement. Stepper motor 115 drives one of the gears 119 in opposing rotational directions, which correspondingly moves the belt 117 in opposing directions thereby moving robot 110 in opposing axial directions along track 120 as shown.

It will be appreciated that many other suitable configurations for motor drive mechanism may be used beyond those shown in FIGS. 8 and 9 (e.g. cable, chain, hydrostatic unit, etc.) so long as the drive mechanism is operable to axially move wafer transport robot 110 through the loadport bridge mechanism 100.

Wafer transport robot 110 further includes at least one a robotic arm 112 as best shown in FIGS. 3 and 6 that is mounted to the movable motor-driven base 114 and configured for holding a wafer. In one embodiment, the robotic arm 112 faces and projects outwards from track 120 and base 114 towards the tools 30 and their access doors 32. In some embodiments, robotic arm 112 is configured similarly to robotic arm 36 of tool robots 34 described herein. In some embodiments, robotic arm 112 of wafer transport robot 110 is capable of partial or full articulating movement similarly to robotic arm 36 of tool robots 34 as described herein. In other embodiments, robotic arm 112 is restricted to horizontal linear axial or longitudinal directional motion (defined by longitudinal axis LA as shown in FIGS. 3 and 8) along track 120 without further articulating movement capability either linearly and/or angularly. Accordingly, in some embodiments robotic arm 112 is stationary and does not move with respect to base 114. The design of the degree of movement provided for robotic arm 36 will be selected dependent upon the specific application requirements.

Figure 7:
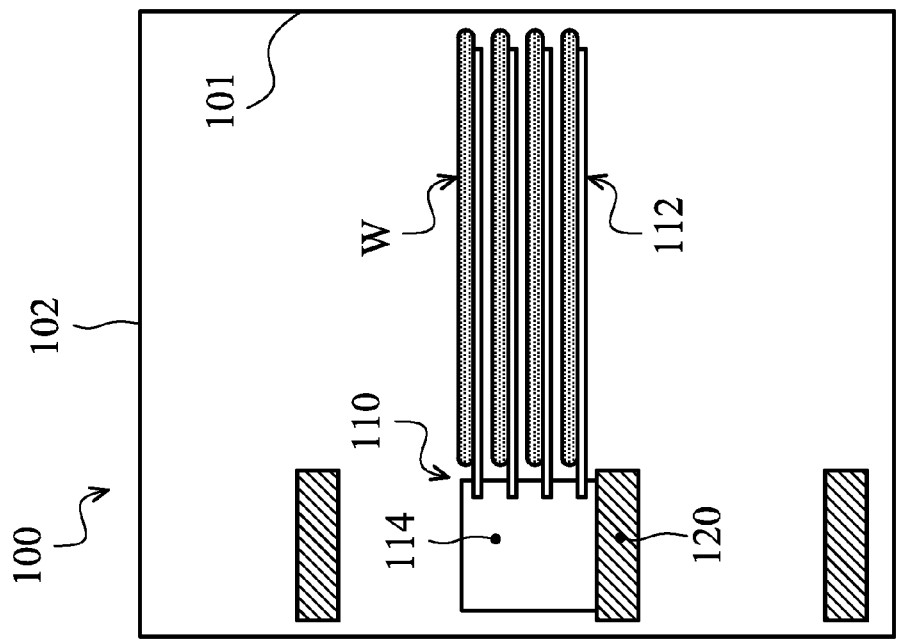
FIG. 7 is a cross-sectional view of the loadport bridge mechanism similar to FIG. 6, but showing an alternative embodiment of a wafer handling robot configured to transport multiple wafers simultaneously.

In alternative embodiments as illustrated in FIG. 7, one or more wafer transport robots 110 may each include multiple stacked robotic arms 112 supported by movable motor-driven base 114 making the robot capable of transporting a plurality of wafers W simultaneously through loadport bridge mechanism 100. This design feature is useful to fit and match the robot design of the tool in some embodiments.

In some embodiments, as shown in FIG. 3, multiple vertically arranged and spaced apart tracks 120 each having a wafer transport robots 110 is provided in some embodiments to allow a plurality of wafers W to be transferred back and forth simultaneously between two adjacent semiconductor tools 30. The number of tracks 120 and robots 110 provided can be designed to meet the particular needs of the semiconductor tools 30 and process steps involved. The movement of each wafer transport robots 110 is independently controllable. In some embodiments, the movement of wafer transport robots 110 are controlled by a computer or microprocessor-based control system 130 associated with loadport bridge mechanism 100 that is programmable with software for controlling the movements of the robots. The control system 130 therefore includes the usual computer/processor based system components as will be well known to those in the art, such as a machine readable storage medium for storing operating instructions or program steps for controlling movement of wafer transport robots 110, non-transitory and transitory memory, a power source, communication links, etc. In some possible embodiments, the movement of wafer transport robots 110 in loadport bridge mechanism 100 is integrated with and controlled by the semiconductor tool processor-based programmable control system associated with a tool 30. Movement of the wafer transport robot s 110 in either of the foregoing control scenarios is coordinated with movement of the tool robots 34 to allow wafers W to be loaded into or unloaded from the loadport bridge mechanism 100 as further describe herein.

The loadport bridge mechanism 100 is intended to be oriented horizontally and mounted between and to loadports 40 on two different semiconductor tools 30 as shown in FIGS. 1-2. In some embodiments, the semiconductor tools 30 are located in relative proximity to each other, and in other embodiments are spaced more distally apart. The spacing of the tools and associated loadports to which loadport bridge mechanism 100 will be mounted will determine the axial or longitudinal length of the bridge mechanism enclosure 102 that is needed. Any suitable enclosure length can be provided as needed.

Proximate to the tool access doors 32, each tool loadport 40 generally includes a horizontally-oriented shelf or platform 42 onto which a wafer carrier 50 such as a FOUP can be removably seated, clamped, and supported as shown in FIGS. 1-2 and 4 for wafer transfer operations between the wafer carrier and tools 30. In some embodiments, platform 42 includes a kinematic plate having coupling pins 44 forming part of a wafer carrier kinematic coupling and mounting system for locating and mating with complementary configured sockets or grooves provided in the bottom of the wafer carrier. The design of such kinematic coupling systems with pin arrangements are covered by industry standards such as SEMI E-57. For a kinematic coupling system if used by loadports 40 of tool 30, the bottom panel 101 at mounting ends 104, 106 of the loadport bridge mechanism enclosure 102 are configured and structured to include such sockets or grooves 46 (see FIG. 3) to receive kinematic pins 44 and other appurtenances to conform to the wafer carrier-loadport interface industry standards for kinematic coupling systems used in the art.

The tool robot 34 normally accesses wafers W from the wafer carrier 50 when positioned on the platform 42. Advantageously, the loadport bridge mechanism 100 in some embodiments does not require any special mounting provisions or modification of the tool loadports 40 or platforms 42 which receive the wafer carrier 50. Loadport bridge mechanism 100 utilizes the same unaltered loadport platforms 42 for support as is typically used to support the wafer carriers 50. Accordingly, the mounting end 104, 160 portions and docking ports 108 are configured similarly to and have the same mounting appurtenances as a wafer carrier 50 such as a FOUP to provide a standardized wafer input/output loadport interfaces per applicable SEMI standards. Advantageously, this allows the same seamless interface of the mounting ends 104, 106 and docking ports 108 of the loadport bridge mechanism enclosure 102 with the tool access doors 32 and loadports 40 of the loadport modules or Equipment Front-End Module (EFEM) on tools 30, which in some embodiments conforms to SEMI standards E15 and E63 (also known as SEMI BOLTS) for loadport interfaces. In some embodiments, the mounting ends 104, 106 and docking ports 108 are configured and operable to provide and meet ISO Class 1 cleanliness standards for the wafer handling environment.

Loadport bridge mechanism 100 defines a wafer transport bridge that spans from one loadport 40 on a first tool 30 to another loadport on a second tool (see FIGS. 1-2 and 4) when mounting ends 1-4, 1-6 are mounted between and to the tools. In some embodiments, loadport bridge mechanism enclosure 102 therefore is raised vertically above and spaced apart from the floor of the FAB by a distance, and fully supported only by the loadports 40 on each tool 30 at the ends 104, 106 of the enclosure 102, as shown. Advantageously, this positioning of loadport bridge mechanism 100 at loadport level creates an axial horizontal wafer path between the two tool loadports 40. Accordingly, the wafers W do not require vertical movement, lowering, or lifting to position them in front of the tool access doors 32 at the tool loadports 40 where they are accessible to the tool robots 34, in contrast to the transport of batches of wafers in a wafer carrier via the FAB AMHS which must be either raised or lowered to the loadports thereby increasing Q time.

If the loadports 40 of the two tools 30 which are to be connected by the loadport bridge mechanism 100 are in relative proximity to each other, no intermediate vertical supports are necessary and the loadport bridge mechanism enclosure 102 is fully supported at each end 104, 106 by the tool loadports (see, e.g. FIGS. 1-2). In other embodiments, if the first and second tools 30 are separated by an appreciable distance, one or more floor-mounted intermediate vertical supports (not shown) of any suitable configuration are provided and positioned between the ends 104, 106 of the loadport bridge mechanism enclosure 102 for additional support. In some embodiments, such vertical supports are configured as a leg or column that engages the bottom panel 101 of the loadport bridge mechanism enclosure 102.

It should be noted that the loadport bridge mechanism 100 occupies a single loadport 40 on each of the two tool 30, thereby leaving the remaining loadports free and accessible for wafer carriers 50 to load and unload wafers W into/from the tools as transported by the AMHS OHT vehicles 24 (see, e.g. FIGS. 1 and 2). The loadport bridge mechanism 100 therefore advantageously does not interfere with the normal operation and bulk movement of wafers W in wafer carriers 50 such as FOUPs to and from the AMHS to the tools 30 (see directional arrows showing vertical movement of the FOUPs from the OHT vehicle 24.

An exemplary method for transferring wafers between semiconductor tools using the loadport bridge mechanism 100 described herein will now be described with reference to FIG. 4. Additional reference is made to FIGS. 1-3 for components previously described herein. In this embodiment, a first tool 30A and a second tool 30B are provided. The tools 30A, 30B can be any type of semiconductor tools found in a FAB. The directional arrows in FIG. 4 show a possible wafer processing flow between tools 30A and 30B. Loadport bridge mechanism 100 is removably secured between loadports 40 on tools 30A and 30B.

As a preliminary step, the loadport bridge mechanism 100 is initially installed and mounted on tools 30A and 30B. A first mounting end 104 is mounted on loadport 40A of tool 30A and second mounting end 106 is mounted on loadport 40B of tool 30B as shown in FIG. 4. The loadport bridge mechanism enclosure 102 is mounted to the tool loadports in a similar manner to docking a wafer carrier on the loadports. In some embodiments, a kinematic mounting interface is used between the tool loadports 40A, 40B and the loadport bridge mechanism 100 as previously described herein. The loadport bridge mechanism 100 is oriented horizontally as shown with the docking port 108 on each end being mated to the tool access doors 32 on each tool (see also FIGS. 1-4). The loadport bridge mechanism 100 is now ready for operation.

Referring to FIG. 4, the method for transporting or transferring wafers between semiconductor tools 30A and 30B begins with lowering a first wafer carrier 50 (which is a FOUP 50A in some non-limiting embodiments) from an OHT vehicle 24 (see FIG. 1) onto loadport 40A of tool 30A in step 1 (steps and wafer movement direction indicated in FIG. 4 by circled numbers and arrows, respectively). A second wafer carrier 50 (which is a FOUP 50B in some non-limiting embodiments) is similarly lowered from an OHT vehicle 24 (see FIG. 1) onto loadport 40B of tool 30B. In this embodiment, as shown in FIG. 4, tools 30A and 30B each have three loadports 40; however, any suitable number of loadports can be provided. In this exemplary and non-limiting embodiment, FOUP 50A can be a "clean" FOUP as referred to in the art having a plurality of wafers W stored within which are yet unprocessed with respect to tool 30A. FOUP 50B can initially be an empty "dirty" FOUP as referred to in the art having a plurality of wafer slots ready to receive wafers W that have been processed in tools 30A and 30B as shown (see directional processing flow arrows). In certain types of semiconductor fabrication process, such as those where chemical-based deposition, cleaning, or etching is performed, placing processed "dirty" wafers back into a clean FOUP can chemically contaminate the "clean" unprocessed wafers therein with various reagents, organic deposits, or byproducts remaining from the processing operation performed in the tool. It is therefore sometimes desirable to use separate FOUPs for dirty (processed) and clean (unprocessed) wafer storage.

With FOUPs 50A and 50B in position on tools 30A and 30B, the tool robot 34 in tool 30A selects, grips, and retrieves a single wafer W from FOUP 50A in the next step 2. The robotic arm 36 of the tool robot 34 extends or projects outwards from tool access door 32 to retrieve the wafer and then retracts with the wafer back into the tool through the access door. In step 3, the wafer W is processed in tool 50A as needed. In step 4, the tool robot 34 in tool 30A transfers the processed wafer W to the wafer transport robot 110 waiting and positioned inside docking port 108 of the loadport bridge mechanism enclosure 102. The robotic arm 36 of the tool robot 34 extends outwards from tool access door 32 to place the wafer W on robotic arm 112 of wafer transport robot 110 and then retracts with the back into the tool through the access door.

With continuing reference to FIG. 4, the wafer transport robot 110 is operated and moves wafer W along a horizontal path from tool 50A to tool 30B along track 120 in steps 5-6 as shown. The track 120 provides guided movement of the wafer transport robot 110. In some embodiments, the transport robot 110 is motor-driven and moves along track 120 via actuation of the on-board motor. The movement of the transport robot 110 is initiated and controlled by control system 130. The wafer W travels through the enclosure 102 of loadport bridge mechanism 100 from a first axial position proximate to first end 104 to a second axial position proximate to second end 106 as shown. It should be noted that the wafer W is otherwise exposed on the wafer transport robot 110 except for the confinement provided by enclosure 102 of loadport bridge mechanism 100 which protects the wafer from the FAB ambient environment.

In step 7 shown in FIG. 4, tool robot 34 in tool 30B grips and retrieves wafer W from wafer transport robot 110. The robotic arm 36 of the tool robot 34 extends or projects outwards from tool access door 32 to grip and retrieve the wafer, and then retracts with the wafer back into the tool through the access door. This is a similar robotic motion to gripping and retrieving a wafer from a wafer carrier 50 such as FOUP. In step 8, the wafer W is processed in tool 30B as needed, or alternatively is retrieved by tool robot 34 for merely loading into waiting FOUP 50B without further processing in tool 30B. In step 9, the tool robot 34 in tool 30b transfers the processed wafer W from tool 30B to awaiting FOUP 50B. The robotic arm 36 of the tool robot 34 extends or projects outwards from tool access door 32 to place the wafer W in a slot within FOUP 50B, and then retracts with the back into the tool through the access door. Once FOUP 50B is filled with the desired number of wafers W processed in tools 30A and 30B, FOUP 50B is ready for pickup by OHT vehicle 24 in step 10, and can be lifted by the OHT vehicle hoist and moved to the next destination via the AMHS.

Figure 5:
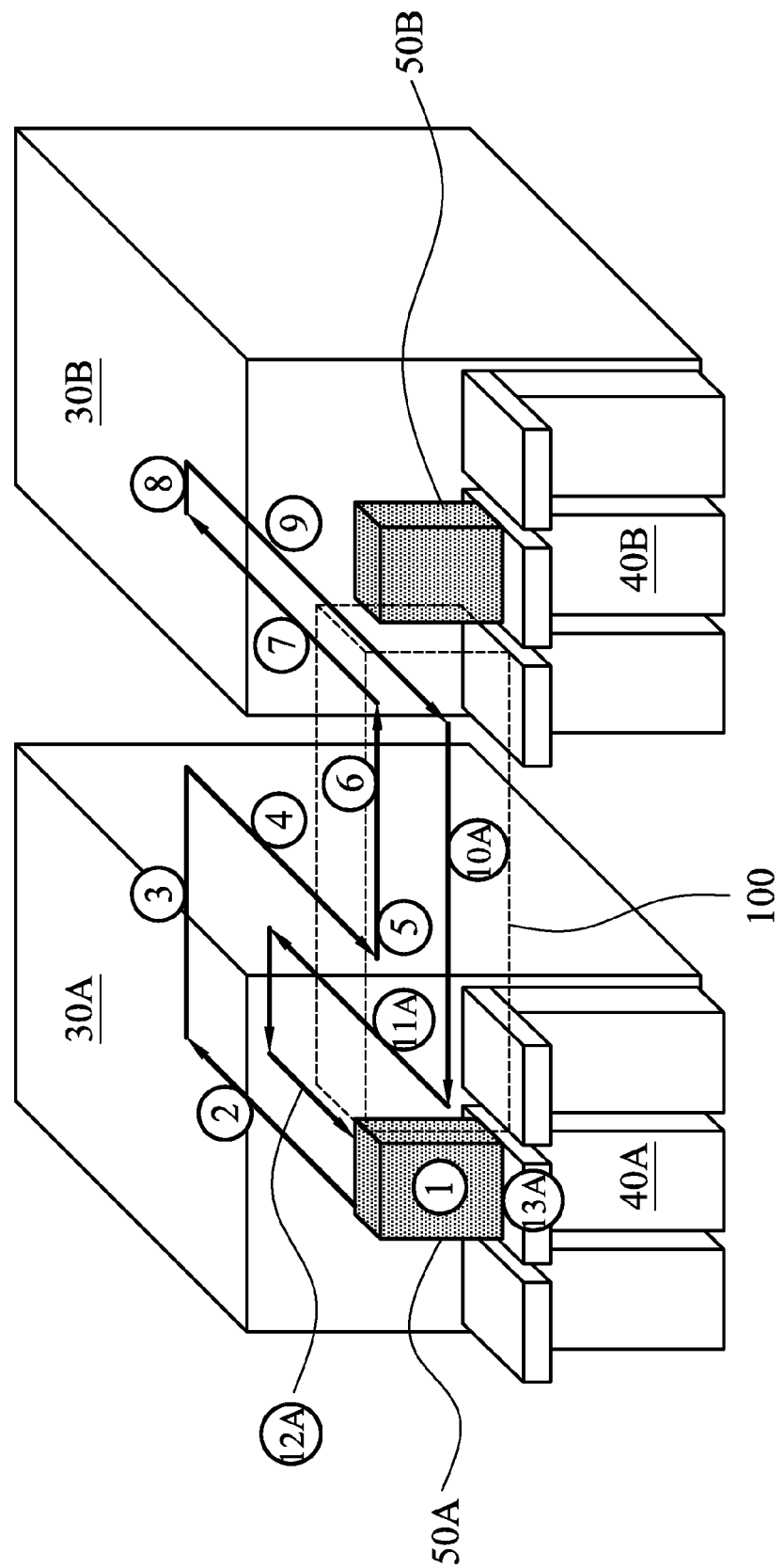
FIG. 5 is schematic perspective drawing similar to FIG. 2 showing another embodiment of a possible wafer flow transport path using the loadport bridge mechanism of FIGS. 1-3.

FIG. 5 shows a variation of the process shown in FIG. 4 and described above. In some embodiments, it can be useful to return the processed wafer W after completion of processing in tool 50B back to the original source FOUP 50A instead of to a second destination FOUP 50B as shown in FIG. 4. As shown in FIG. 5, after completion of processing in step 8, the tool robot 34 in tool 30B transfers wafer W back to the wafer transport robot 110 in loadport bridge mechanism 100 in step 9A. The wafer W is then transported by wafer transport robot 110 back across loadport bridge mechanism 100 to tool 30A in step 10A. In step 11A, wafer W is transferred by wafer transport robot 110 back to tool robot 34 in tool 30A. The tool robot 34 then transfers wafer W to FOUP 50A in step 12A. Once FOUP 50A is filled with wafers W processed in tools 30A and 30B, FOUP 50A is ready for pickup by OHT vehicle 24 in step 13A.

It will be appreciated that numerous variations of the foregoing processing methods are possible for transferring wafers between tools 30A and 30B, and FOUPs 50A and 50B depending on the processing and wafer transport needs for a given step of processing requirements. In addition, using a plurality of vertically stacked tracks 120 each having an associated wafer transport robot 110, multiple wafers can be transported back and forth through loadport bridge mechanism 100 simultaneously in either axial horizontal direction.

FIGS. 5 and 6 merely show the processing and transport flow path of a single wafer for clarity.

According to one aspect of the present disclosure, a wafer handling system for a semiconductor fabrication facility (FAB) is provided. In one embodiment, the wafer handling system includes a first semiconductor tool having a first loadport being configured for receiving a first wafer carrier operable to hold a plurality of wafers, a second semiconductor tool having a second loadport being configured for receiving a second wafer carrier operable to hold a plurality of wafers, and a loadport bridge mechanism spanning between the first and second loadports. The loadport bridge mechanism includes a wafer transport robot operable to transport a wafer from the first tool to the second tool. The loadport bridge mechanism is supported by the first and second loadports and raised above a floor of the FAB. Advantageously, the loadport bridge mechanism occupies the same first and second loadports as would be normally occupied by a wafer carrier if in place and does not require any special modification of the tool's original loadport design. The loadport bridge mechanism therefore has loadport mounting ends that are complementary configured similarly to and compatible with the mounting interface of the wafer carrier that would ordinarily be docked at the tool's same loadports which are used by the loadport bridge mechanism.

According to one aspect of the present disclosure, an apparatus for transporting wafers between loadports of semiconductor tools is provided. In one embodiment, the apparatus includes an elongated enclosure having opposing ends configured for mounting to a loadport of a semiconductor tool, at least one track positioned within the enclosure and extending axially between the ends, and a robot movable along the track in opposing axial directions; the robot being configured for holding a wafer. When the apparatus is mounted to the loadports of first and second semiconductor tools, the robot is operable to transport the wafer along a horizontal path on the track from the first tool to the second tool. In one embodiment, the apparatus further includes a docking port located at each end of the enclosure, each docking port being complementary configured for mating to a tool access door.

According to one aspect of the present disclosure, a method for transporting a wafer between loadports of semiconductor tools, is provided. In one embodiment, the method includes: providing a first tool having a first loadport and a second tool having a second loadport; at the first loadport, placing a wafer from the first tool onto a wafer transport robot disposed in a loadport bridge enclosure, the enclosure extending horizontally between the first and second loadports; and transporting the wafer through the enclosure from the first loadport to the second loadport. The method further includes the second tool retrieving the wafer from the wafer transport robot at the second loadport. In one embodiment, the transporting step includes guiding the wafer transport robot along a horizontal track from the first loadport to the second loadport.

Advantages of a loadport bridge mechanism according to the present disclosure include not only improving wafer transportation time for solving AMHS traffic jams by shorter and quicker transports through the bridge between tools, but also another key factor is the processed wafer can be transported to next tool without waiting for the rest wafers to complete process in the same carrier. For a fully-loaded 25 wafer piece FOUP, this means that the first wafer's Q time can be further reduced by 24 times the wafer processing time by loadport bridge mechanism disclosed herein.

While the foregoing description and drawings represent exemplary embodiments of the present disclosure, it will be understood that various additions, modifications and substitutions can be made therein without departing from the spirit and scope and range of equivalents of the accompanying claims. In particular, it will be clear to those skilled in the art that the present disclosure can be embodied in other forms, structures, arrangements, proportions, sizes, and with other elements, materials, and components, without departing from the spirit or essential characteristics thereof. In addition, numerous variations in the methods/processes and/or control logic as applicable described herein can be made without departing from the spirit of the disclosure. One skilled in the art will further appreciate that the disclosure can be used with many modifications of structure, arrangement, proportions, sizes, materials, and components and otherwise, used in the practice of the disclosure, which are particularly adapted to specific environments and operative requirements without departing from the principles of the present disclosure. The presently disclosed embodiments are therefore to be considered in all respects as illustrative and not restrictive, the scope of the disclosure being defined by the appended claims and equivalents thereof, and not limited to the foregoing description or embodiments. Rather, the appended claims should be construed broadly, to include other variants and embodiments of the disclosure, which can be made by those skilled in the art without departing from the scope and range of equivalents of the disclosure.

What is claimed is:

1. A wafer handling system for a semiconductor fabrication facility (FAB), comprising:
    a first semiconductor tool having a plurality of loadports including a first loadport, each of the plurality of loadports having a single respective tool access door and being configured for receiving a first wafer carrier operable to hold a plurality of wafers;
    a second semiconductor tool having a plurality of loadports including a second loadport, each of the plurality of loadports having a single respective tool access door and being configured for receiving a second wafer carrier operable to hold a plurality of wafers; and
    a loadport bridge mechanism spanning between the first and second loadports, the loadport bridge mechanism including wafer transport robot configured and operable to transport a wafer outside a wafer carrier from the respective tool access door of the first loadport of the first semiconductor tool to the respective tool access door of the second loadport of the second semiconductor tool.

2. The wafer handling system of claim 1, wherein the loadport bridge mechanism includes first and second mounting ends which are complementary configured to interface with the loadports of the tools.

3. The wafer handling system of claim 2, wherein the mounting ends are configured for a kinematic coupling system provided with the loadports for docking a wafer carrier at the loadports.

4. The wafer handling system of claim 1, further comprising a track disposed in the loadport bridge mechanism that guides movement of the wafer transport robot, the wafer transport robot being movable along the track.

5. The wafer handling system of claim 1, wherein the loadport bridge mechanism includes an elongated enclosure, the wafer transport robot being movably disposed within the enclosure.

6. The wafer handling system of claim 5, further comprising a docking port disposed at each of two opposing ends of the enclosure, each docking port including an opening configured to complement one of the respective tool access doors of the first and second loadports.

7. The wafer handling system of claim 6, wherein the docking ports are sealable to the tool access doors to provide a controlled environment within the enclosure.

8. The wafer handling system of claim 5, wherein the enclosure is oriented horizontally between the first and second tools.

9. The wafer handling system of claim 1, wherein the wafer transport robot is motor-driven and movable along a track, and comprises a motor-driven base and at least one arm mounted to the motor-driven base, the at least one arm capable of multi-directional movement to grasp or release a wafer.

10. An apparatus for transporting wafers between loadports of semiconductor tools, comprising:
   an elongated enclosure having two opposing ends, each end configured for mounting to a loadport of a semiconductor tool, wherein each loadport has a single respective tool access door;
   two docking ports, each dock port located at a respective end of the elongated enclosure, each docking port being complementary configured for mating to a respective tool access door of a semiconductor tool;
   at least one track positioned within the enclosure and extending axially between the ends; and
   a robot movable along the track in opposing axial directions, the robot being configured for holding and transporting a wafer outside a wafer carrier;
   wherein when the apparatus is mounted to the loadports of first and second semiconductor tools, the robot is operable to transport the wafer along a path on the track from the respective tool access door of the first semiconductor tool to the respective tool access door of the second semiconductor tool.

11. The apparatus of claim 10, wherein the docking ports are sealable to the tool access doors to provide a controlled environment within the enclosure.

12. The apparatus of claim 10, wherein the ends of the enclosure are configured for a kinematic coupling system.

13. The apparatus of claim 10, wherein the enclosure is oriented horizontally when positioned between the loadports of a first and second tool.

14. The apparatus of claim 13, wherein the enclosure is raised above a floor of a semiconductor FAB.

15. The apparatus of claim 10, wherein the wafer transport robot is motor-driven and movable along a track, and comprises a motor-driven base and at least one arm mounted to the motor-driven base, the at least one arm capable of multi-directional movement to grasp or release a wafer.

16. The apparatus of claim 10, further comprising:
   a second track positioned within the enclosure and extending axially between the ends; and
   a second robot movable along the second track in opposing axial directions, the second robot being configured for holding a wafer.

17. A method for transporting a wafer between loadports of semiconductor tools, the method comprising:
   providing a first tool having a plurality of loadports including a first loadport and a second tool having a plurality of loadports including a second loadport, each of the plurality of loadports having a single respective tool access door;
   at the first loadport, placing a wafer from the first tool onto a wafer transport robot disposed in a loadport bridge enclosure, the enclosure extending between the first and second loadports; and
   transporting the wafer through the enclosure from the respective tool access door of the first loadport to the respective tool access door of the second loadport, wherein the wafer is transported outside a wafer carrier.

18. The method of claim 17, further comprising the second tool retrieving the wafer from the wafer transport robot at the second loadport.

19. The method of claim 17, wherein the transporting step including guiding the wafer transport robot along a horizontal track from the first loadport to the second loadport.

* * * * *